(12) United States Patent
Song et al.

(10) Patent No.: US 7,537,956 B2
(45) Date of Patent: May 26, 2009

(54) SILICON OPTOELECTRONIC DEVICE MANUFACTURING METHOD AND SILICON OPTOELECTRONIC DEVICE MANUFACTURED BY THEREOF AND IMAGE INPUT AND/OR OUTPUT APPARATUS HAVING THE SAME

(75) Inventors: In-jae Song, Yongin-si (KR); Byoung-lyong Choi, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 253 days.

(21) Appl. No.: 11/285,192

(22) Filed: Nov. 23, 2005

(65) Prior Publication Data
US 2006/0113552 A1    Jun. 1, 2006

(30) Foreign Application Priority Data
Nov. 27, 2004    (KR)    ........................ 10-2004-0098377

(51) Int. Cl.
*H01L 21/00* (2006.01)
(52) U.S. Cl. .............................. 438/57; 438/70; 438/72; 438/73; 438/96; 438/97; 257/E25.001; 257/E25.029; 257/E25.032
(58) Field of Classification Search .............. 438/57–98; 257/87, 79, 197, E25.001, E25.029, E25.032
See application file for complete search history.

(56) References Cited

U.S. PATENT DOCUMENTS 3,879,606 A    4/1975    Bean (Continued)

FOREIGN PATENT DOCUMENTS

JP    5-288020    11/1993

(Continued)

OTHER PUBLICATIONS

K. T-Y Kung et al., "Implant-dose dependence of grain size and {110} texture enhancements in polycrystalline Si films by seed selection through ion channeling," J. Appl. Phys., Apr. 1, 1986, pp. 2422-2428, vol. 59, No. 7, American Institute of Physics, US.

(Continued)

*Primary Examiner*—Walter L Lindsay, Jr.
*Assistant Examiner*—Abdulfattah Mustapha
(74) *Attorney, Agent, or Firm*—Buchanan Ingersoll & Rooney PC

(57) ABSTRACT

A method of manufacturing a silicon optoelectronic device, a silicon optoelectronic device manufactured by the method and an image input and/or output apparatus having the silicon optoelectronic device are provided. The method includes: preparing an n-type or a p-type silicon-based substrate; forming a polysilicon having a predetermined depth at one or more predetermined regions of a surface of the substrate in order to form a microdefect flection pattern having a desired microcavity length; oxidizing the surface of the substrate where the polysilicon is formed for forming a silicon oxidation layer on the substrate and forming a microdefect flection pattern having a desired microcavity length at an interface between the substrate and the silicon oxidation layer, wherein the microdefect flection pattern is formed by a difference between an oxidation rate of the polysilicon and an oxidation rate of a material of the substrate during formation of the silicon oxidation layer; exposing the microdefect flection pattern by etching a region of the silicon oxidation layer where the polysilicon is formed; and forming a doping region by doping the exposed microdefect flection pattern in a type opposite to a type of the substrate.

11 Claims, 12 Drawing Sheets

U.S. PATENT DOCUMENTS

| | | | |
|---|---|---|---|
| 4,210,923 A | 7/1980 | North et al. | |
| 4,371,847 A | 2/1983 | Biard et al. | |
| 4,684,964 A | 8/1987 | Pankove et al. | |
| 5,093,576 A | 3/1992 | Edmond et al. | |
| 5,101,246 A | 3/1992 | Onodera | |
| 5,223,919 A | 6/1993 | Whight et al. | |
| 5,268,317 A | 12/1993 | Schwalke et al. | |
| 5,283,447 A | 2/1994 | Olbright et al. | |
| 5,293,393 A | 3/1994 | Kosaka | |
| 5,324,965 A | 6/1994 | Tompsett et al. | |
| 5,361,273 A | 11/1994 | Kosaka | |
| 5,391,896 A | 2/1995 | Wanlass | |
| 5,514,620 A | 5/1996 | Aoki et al. | |
| 5,565,676 A | 10/1996 | Tanabe et al. | |
| 5,574,744 A | 11/1996 | Gaw et al. | |
| 5,583,351 A | 12/1996 | Brown et al. | |
| 5,607,876 A * | 3/1997 | Biegelsen et al. | 438/45 |
| 5,726,440 A * | 3/1998 | Kalkhoran et al. | 250/214.1 |
| 5,793,060 A | 8/1998 | Morikawa | |
| 5,838,174 A | 11/1998 | Nakagawa et al. | |
| 5,908,307 A | 6/1999 | Talwar et al. | |
| 5,920,078 A | 7/1999 | Frey | |
| 6,147,366 A | 11/2000 | Drottar et al. | |
| 6,297,115 B1 | 10/2001 | Yu | |
| 6,355,945 B1 | 3/2002 | Kadota et al. | |
| 6,552,373 B2 | 4/2003 | Ando et al. | |
| 6,566,595 B2 | 5/2003 | Suzuki | |
| 6,664,744 B2 | 12/2003 | Dietz | |
| 6,693,736 B1 | 2/2004 | Yoshimura et al. | |
| 6,744,072 B2 | 6/2004 | Romano et al. | |
| 6,758,608 B2 | 7/2004 | Van Arendonk et al. | |
| 6,806,111 B1 | 10/2004 | Ehrichs et al. | |
| 6,930,330 B2 | 8/2005 | Choi et al. | |
| 7,012,239 B2 | 3/2006 | Kim et al. | |
| 7,157,741 B2 | 1/2007 | Kim et al. | |
| 7,253,491 B2 | 8/2007 | Lee et al. | |
| 2002/0131727 A1 | 9/2002 | Reedy et al. | |
| 2002/0181915 A1 | 12/2002 | Craig et al. | |
| 2003/0020121 A1 | 1/2003 | Rockwell et al. | |
| 2003/0127655 A1 * | 7/2003 | Choi et al. | 257/79 |
| 2003/0136969 A1 | 7/2003 | Kuniyasu | |
| 2003/0160179 A1 * | 8/2003 | Yeh et al. | 250/423 R |
| 2003/0218666 A1 | 11/2003 | Holm et al. | |
| 2004/0227140 A1 | 11/2004 | Lee et al. | |
| 2006/0113552 A1 | 6/2006 | Song et al. | |
| 2006/0115916 A1 | 6/2006 | Lee et al. | |
| 2006/0226445 A1 * | 10/2006 | Song et al. | 257/197 |
| 2006/0252171 A1 | 11/2006 | Lee et al. | |

FOREIGN PATENT DOCUMENTS

| | | |
|---|---|---|
| JP | 06-045645 A | 2/1994 |
| SU | 728183 B * | 4/1980 |

OTHER PUBLICATIONS

K. T-Y. Kung et al., "Implant-dose Dependence of Grain Size and (110) Texture Enhancements in Polycrystalline Si Films by Seed Selection Through Ion Channeling" J. Appl. Phys. 1986, vol. 59, No. 7, pp. 2422-2428.

* cited by examiner

SILICON OPTOELECTRONIC DEVICE MANUFACTURING METHOD AND SILICON OPTOELECTRONIC DEVICE MANUFACTURED BY THEREOF AND IMAGE INPUT AND/OR OUTPUT APPARATUS HAVING THE SAME

CROSS-REFERENCE TO RELATED PATENT APPLICATION

This application claims the benefit of Korean Patent Application No. 10-2004-0098377, filed on Nov. 27, 2004, in the Korean Intellectual Property Office, the disclosure of which is incorporated herein in its entirety by reference.

BACKGROUND OF THE DISCLOSURE

1. Field of the Disclosure The present disclosure relates to a method of manufacturing a silicon optoelectronic device, a silicon optoelectronic device manufactured by the method and an image input and/or output apparatus utilizing the silicon optoelectronic device.

2. Description of the Related Art

An advantage of using a silicon semiconductor substrate is that it provides excellent reliability and allows the highly integrated density of the logic device, an operation device, and a drive device on the substrate. Also, a silicon semiconductor material can be used in fabrication of a highly integrated circuit at a much lower cost than a compound semiconductor material, due to the use of inexpensive silicon. That is why many integrated circuits use silicon as their basic material.

In this regard, studies on fabrication of silicon-based light-emitting devices have been continued to compatibly use them in the fabrication of integrated circuits and to obtain inexpensive photoelectronic devices.

The present applicant has described a silicon optoelectronic device in U.S. patent application Ser. No. 10/122,421, filed on Apr. 16, 2002. The silicon optoelectronic device includes an ultra-shallow doping region to form a quantum structure in a p-n junction of a silicon-based substrate.

In the silicon optoelectronic device described in the above application, a period of surface flections, i.e., microdefect enhancing wavelength selectivity, is formed by the self-assembly under a specific oxidation condition and a specific diffusion process. For this reason, uniform formation and reproduction of the microdefects are very difficult.

As described in the U.S. patent application Ser. No. 10/122,421, the wavelength of the silicon optoelectronic device has light emitting characteristics or/and light receiving characteristics by the quantum structure formed by an ultra-shallow diffusion process, and is determined by a period of the microdefect, which is a microcavity length. Thus, the microdefect must be repeatedly arranged with a specific period to select a desire wavelength band.

SUMMARY OF THE DISCLOSURE

The present invention may provide a method of manufacturing a silicon optoelectronic device for increasing wavelength selectivity by controlling a microcavity length. The present invention also may provide a silicon optoelectronic device manufactured by the method and an image input and/or output apparatus having the same.

According to an aspect of the present invention, there may be provided a method of manufacturing a silicon optoelectronic device, including: preparing an n-type or a p-type silicon-based substrate; forming a polysilicon having a predetermined depth at one or more predetermined regions of a surface of the substrate in order to form a microdefect flection pattern having a desired microcavity length; oxidizing the surface of the substrate where the polysilicon is formed to form a silicon oxidation layer on the substrate and forming a microdefect flection pattern having a desired microcavity length at an interface between the substrate and the silicon oxidation layer, wherein the microdefect flection pattern is formed by a difference between an oxidation rate of the polysilicon and an oxidation rate of a material of the substrate during formation of the silicon oxidation layer; exposing the microdefect flection pattern by etching a region of the silicon oxidation layer where the polysilicon is formed; and forming a doping region by doping the exposed microdefect flection pattern in a type opposite to a type of the substrate.

The forming of the polysilicon may include: forming an amorphous silicon by implanting a preamorphization material into the predetermined region of substrate until reaching a desired depth; and transforming the formed amorphous silicon to a polysilicon by a high temperature process.

The preamorphization material may be a silicon ion or an inactive element.

The forming of the polysilicon may be performed repeatedly a predetermined number of times for forming a plurality of the polysilicons having different depths at plural regions of the substrate, a plurality of microdefect patterns having different period are formed by an oxidation process, and an etching process and a doping process are performed for manufacturing a silicon optoelectronic device having a plurality of silicon optoelectronic elements for emitting and/or receiving light of different wavelengths.

A group of a plurality of polysilicons may be formed on the substrate as a two-dimensional array, and an oxidation process, an etching process and a doping process are carried out for forming a two-dimensional array of a silicon optoelectronic device emitting and/or receiving light having plurality of wavelengths.

The oxidation process may be performed in a gas atmosphere containing of an oxygen gas and a chlorine gas.

The method may further include forming an electrode pattern at the doping region to be electrically connected to the doping region.

The doping region may be formed to have a quantum structure generating optoelectric conversion effect by a quantum confinement effect at a p-n junction between the doping region and the substrate.

According to another aspect of the present invention, there is provided a silicon optoelectronic device manufactured by a method including at least one of the above mentioned features.

According to still another aspect of the present invention, there is provided an image input and/or output apparatus including: a silicon optoelectronic device panel formed by arranging silicon optoelectronic devices inputting and/or outputting an image as a two-dimensional array on a n-type or a p-type of silicon-based substrate, wherein the silicon optoelectronic devices are silicon optoelectronic devices as described herein.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

The present invention will now be described more fully with reference to the accompanying drawings, in which exemplary embodiments of a method of manufacturing a silicon optoelectronic device, a silicon optoelectronic device manufactured by the method, and an image input and/or output apparatus according to the present invention are shown.

FIGS. 1 through 7 show a manufacturing process of a silicon optoelectronic device according to an embodiment of the present invention.

Figure 1:
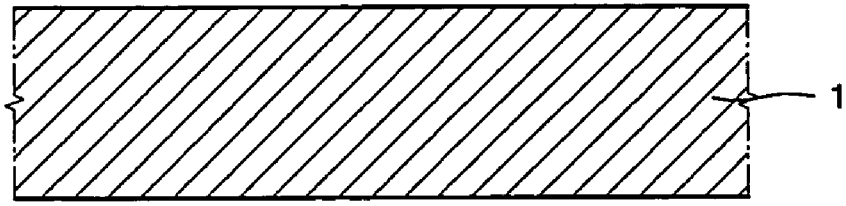
FIGS. 1 through 7 show a manufacturing process of a silicon optoelectronic device according to an embodiment of the present invention.

Referring to FIG. 1, an n-type or p-type silicon-based substrate 1 is prepared. The substrate 1 may be made of a predetermined semiconductor material containing of silicon (Si), for example, Si or SiC. The substrate 1 is doped with an n-type dopant. A silicon based wafer may be used as the substrate 1. Alternatively, the substrate 1 is made of diamond.

Figure 2A:
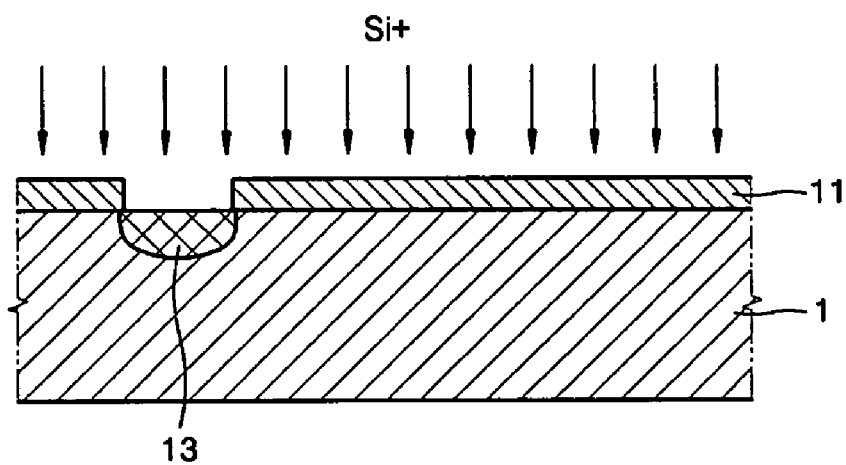
Figure 2B:
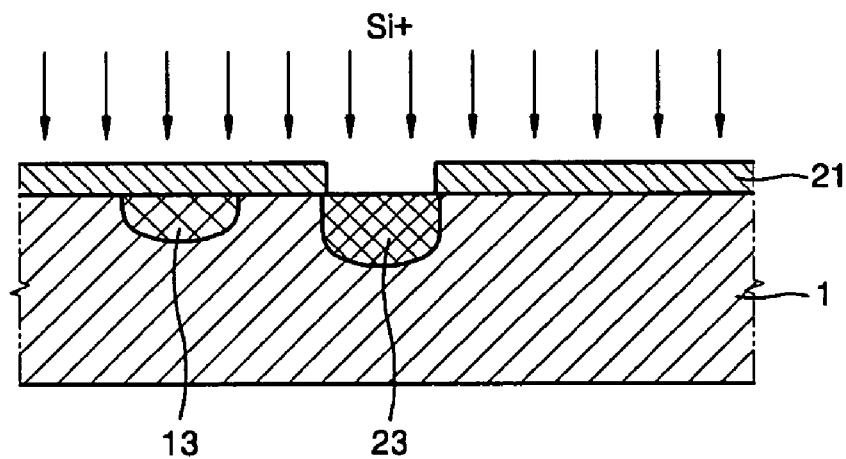
Figure 2C:
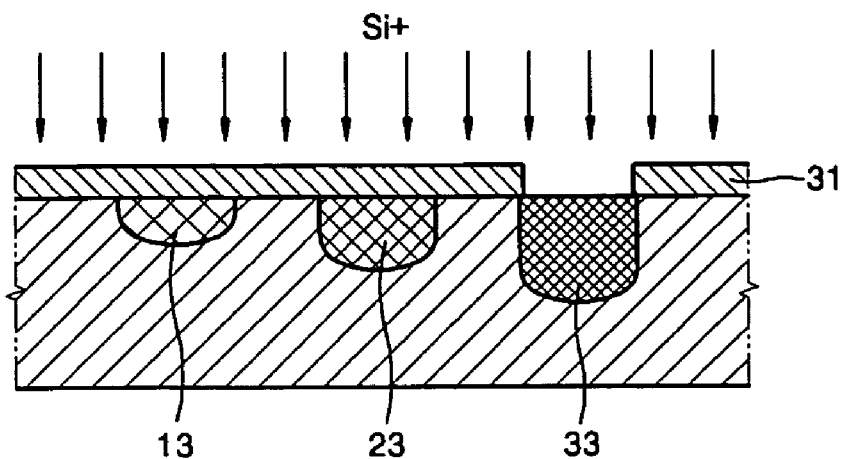

Next, polysilicon is formed at predetermined regions of a surface of the substrate 1 according to manufacturing processes shown in FIGS. 2A through 2D. FIGS. 2A through 2C show an embodiment of a method of forming polysilicons having different depths on three regions in the substrate 1 for obtaining microdefect flection patterns having a different period for emitting and/or receiving a red light, a green light and a blue light.

Figure 2D:
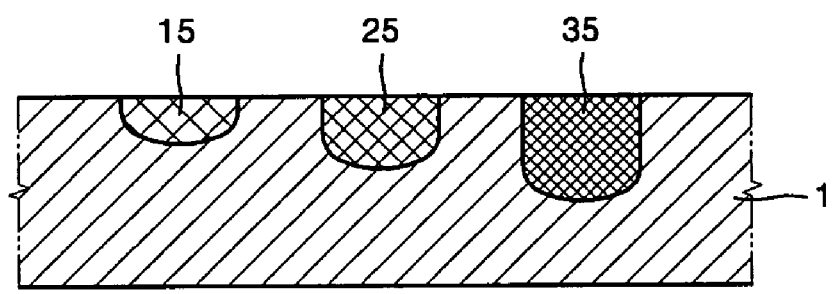

Referring to FIG. 2A, a first photoresist layer 11 is formed on the substrate 1 for forming a first polysilicon 15 shown in FIG. 2D. The first photoresist layer 11 is formed to have in a desired region of the substrate to form a first polysilicon 15. The photoresist layers 11, 21, 31 shown in FIGS. 2A through 2C may be formed by forming the photoresist layers on the substrates and etching region of each photoresist layer corresponding to desired regions to form a polysilicon.

After forming the photoresist layer 11 on the substrate 1, a first amorphous silicon 13 is formed by implanting a Si preamorphization material through the opening of the photoresist layer 11 until reaching a predetermined depth. After forming the first amorphous silicon 13, the photoresist layer 11 is eliminated. The preamorphization material may be implanted based on an implant method. By controlling implant time and power, the depth of implanting the preamorphization material can be controlled. Therefore, the preamorphization material can be implanted until reaching a desired depth.

After eliminating the photoresist layer 11, a photoresist layer 21 is formed on the substrate 1 where the first amorphous silicon 13 is formed as shown in FIG. 2B. The photoresist layer 21 also is formed to have an opening which matches a predetermined region of the substrate 1 where a second polysilicon 25 shown in FIG. 2D is to be formed. The opening of the photoresist layer 21 is spaced from the first amorphous silicon 13 formed in the region to form the first polysilicon 15.

After forming the photoresist layer 21, the preamorphization material is implanted to a predetermined region of the substrate 1 through the opening of the photoresist layer 21 so that a second amorphous silicon 23 is formed. The second amorphous silicon 23 is formed to have a different depth than the first amorphous silicon 13. That is, the second amorphous silicon 23 has different thickness comparing to the first amorphous silicon 13. FIG. 2B shows an exemplary embodiment to form the second amorphous silicon 23 deeper than the first amorphous silicon 13. After forming the second amorphous silicon 23, the photoresist layer 21 is eliminated.

After eliminating the photoresist layer 21, a photoresist layer 31 is formed on the substrate 1 where the first and the second amorphous silicon 13 and 23 are formed as shown in FIG. 2C. The photoresist layer 31 is formed to have an opening which matches a region of the substrate where a third amorphous silicon 33 shown in FIG. 2D is to be formed. The opening of the photoresist layer 31 is spaced from the first and the second amorphous silicon 13 and 23 formed in the regions to form the first and the second polysilicons 15 and 25.

After forming the photoresist layer 31, the preamorphization material is implanted to a predetermined region of the substrate 1 through the opening of the photoresist layer 31 so that a third amorphous silicon 33 is formed. The third amorphous silicon 33 is formed to have a different depth compared to the first and the second amorphous silicon 13, 23. That is, the third amorphous silicon 33 is formed to have a different thickness compared to the first and the second amorphous silicon 13 and 23. FIG. 2C shows an exemplary embodiment to form the third amorphous silicon 33 deeper than the first and the second amorphous silicon 13 and 23. After forming the third amorphous silicon 33, the photoresist layer 31 is eliminated.

If the photoresist layer 31 is eliminated, the first, the second and the third amorphous silicon 13, 23, 33 formed substrate 1 is obtained. As described above, the first, the second and the third amorphous silicon 13, 23, 33 have different depths and are spaced with respect to each other.

The implant time and implant power to implant a preamorphization material are differently controlled for forming each of the first, the second and the third amorphous silicon 13, 23, 33 to have different thicknesses.

After forming the amorphous silicon 13, 23, 33, the substrate 1 is placed in a furnace and the temperature of the furnace is increased, for example, to about 1150° C. Referring to FIG. 2D, the first, the second and the third amorphous silicon 13, 23, 33 are transformed to a first, a second and a third polysilicon 15, 25, 35 by this high temperature process. As a result, the first, the second and the third polysilicon 15, 25, 35 are formed to have different depths.

As described above, the amorphous silicon is converted to polysilicon by the high temperature process. The preamorphization material may be silicon ion including $Si^{2+}$ or $Si^{3+}$ or an inactive element.

The thicknesses of the first, the second and the third polysilicon 15, 25, 35 are determined to be proper to form a period of a microdefect corresponding to the wavelength of the light to be emitted or/and to be received by a microdefect flection pattern formed by a later oxidation process.

Figure 3:
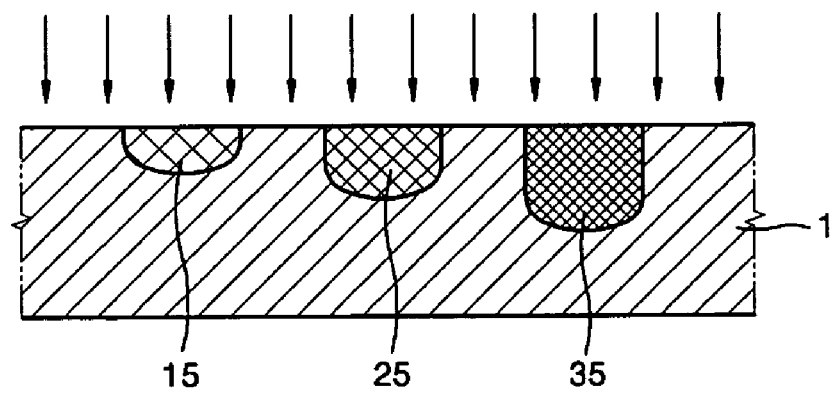

After forming the polysilicons, the oxidation process, i.e., a dry oxidation process, is performed as shown in FIG. 3 for forming a silicon oxidation layer ($SiO_2$) 40 on a surface of the substrate where the first, the second and third polysilicon 15, 25 and 35 are formed.

The oxidation process may be performed based on a dry oxidation process in a gas atmosphere containing of $O_2$ and $Cl_2$. The dry oxidation process is carried out at a progressively increasing high temperature to about 1150° C. The dry oxidation process is performed for about several hours to several tens hours. The oxidation process may be performed based on a wet oxidation process.

Nitrogen gas is basally injected to a vacuum chamber for the oxidation process to control an inner pressure of the vacuum chamber. The inner pressure of vacuum chamber is set by using mainly oxygen $O_2$ and nitrogen $N_2$. Chlorine gas $Cl_2$ is included in the vacuum chamber at a small ratio compared to the oxygen $O_2$, for example, at about 5%.

It is preferable that the oxidation process progresses until the silicon oxidation layer 40 is formed from the surface of the substrate 1 to a depth passing through a boundary between the second polysilicon 25 and the substrate 1, wherein the second polysilicon 25 has an intermediate or mid depth compared to the first and the third polysilicon 15, 35. Also, the oxidation process may progress until the silicon oxidation layers 40 are formed from the surface of the substrate 1 to a depth passing through a boundary between the substrate 1 and the third polysilicon 35 wherein the third polysilicon has the deepest depth.

While forming the silicon oxidation layer 40, microdefect flection patterns are formed on a boundary between the silicon oxidation layer 40 and the substrate 1 to have different a microcavity length according to the depth of the polysilicon because an oxidation rate of the polysilicon is different from an oxidation rate of a material of the substrate such as crystalloid silicon.

Figure 8A:
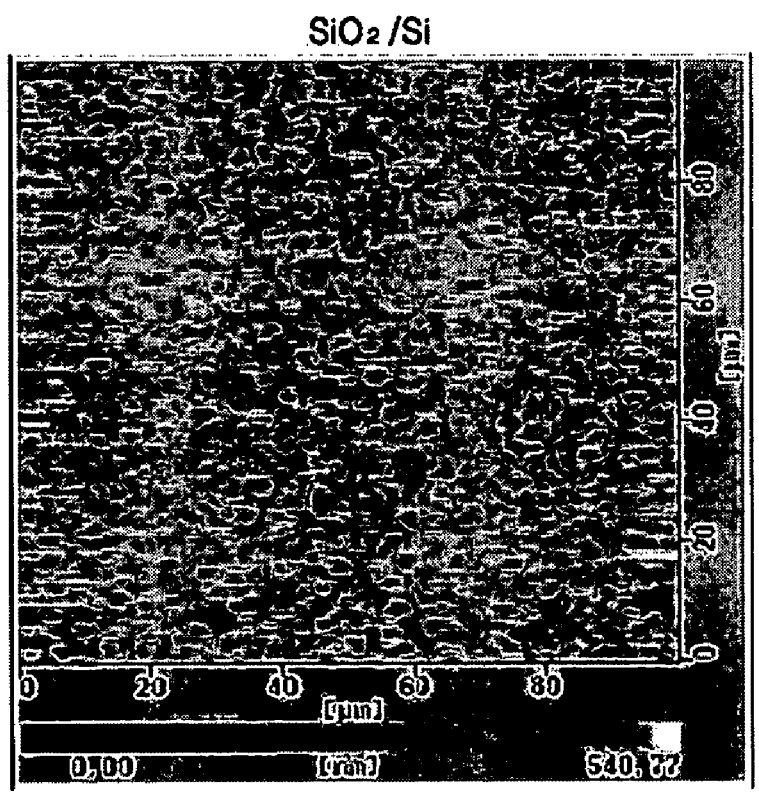
FIG. 8A shows an atomic force microscope (AFM) image of an interface ($SiO_2$/Si interface) between a silicon oxidation layer and a substrate when the silicon oxidation layer is formed by oxidizing a crystalloid silicon without forming amorphous silicon.
Figure 8B:
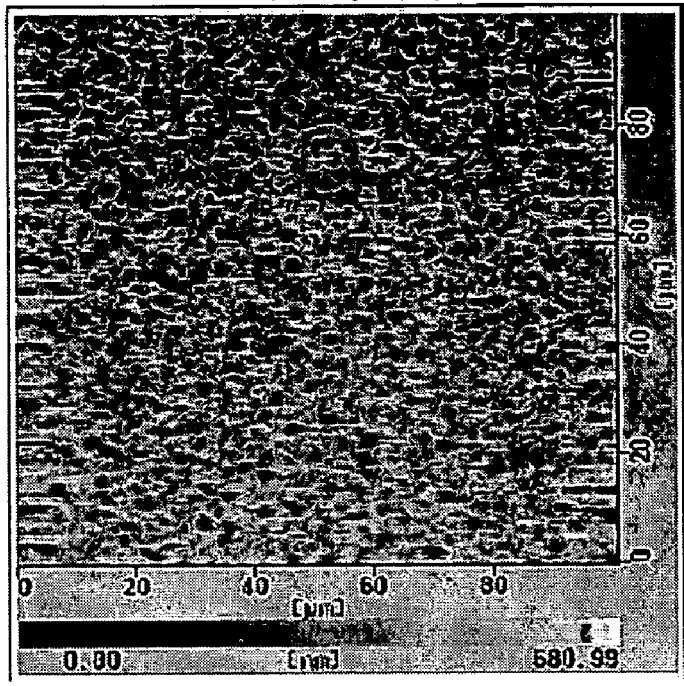
FIG. 8B shows an AFM image of a $SiO_2$/Si interface when the amorphous silicon of 500 Å depth is formed.

FIG. 8A shows an atomic force microscope (AFM) image of an interface ($SiO_2$/Si interface) between a silicon oxidation layer and a silicon substrate when the silicon oxidation layer is formed by oxidizing a crystalloid silicon without forming amorphous silicon. Hereinafter, the interface is called as a $SiO_2$/Si interface. FIG. 8B shows an AFM image of a $SiO_2$/Si interface when the amorphous silicon of 500 Å depth is formed and FIG. 8C shows an AFM image of $SiO_2$/Si interface when the amorphous silicon of 2000 Å depth is formed.

Figure 8C:
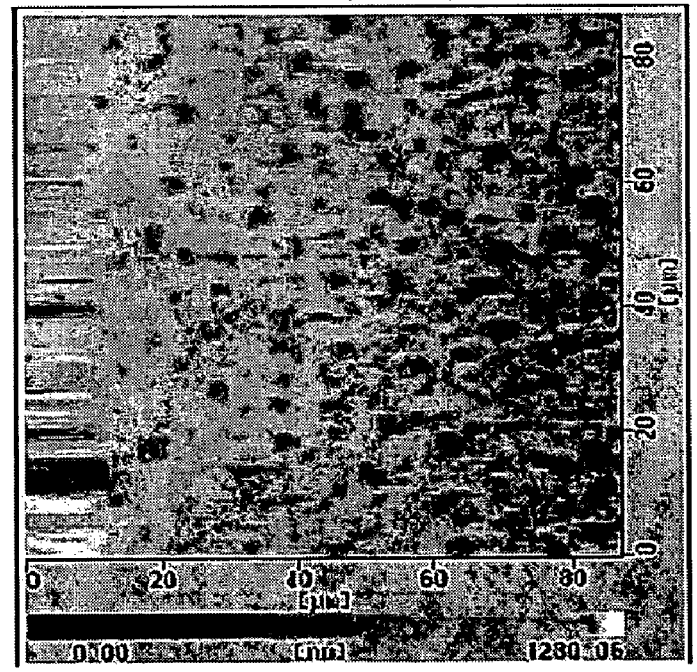
FIG. 8C shows an AFM image of $SiO_2$/Si interface when the amorphous silicon of 2000 Å depth is formed.

The AFM images of FIGS. 8A through 8C are obtained under following conditions. Three samples, which are a silicon wafer, a silicon wafer formed the amorphous silicon of 500 Å, and a silicon wafer formed the amorphous silicon of 2000 Å, are oxidized for 17 hours in a gas atmosphere containing of 2500 sccm oxygen ($O_2$), 4500 sccm Nitrogen ($N_2$), and 20 sccm chlorine ($Cl_2$) under 650 Torr pressure. The three oxidized samples are scanned within a scan range of 90 µm×90 µm by using an atomic force microscope (AFM) using a silicon (Si) tip. The samples of FIGS. 8B and 8C are oxidized after forming the 500 Å and 2000 Å amorphous silicon on the silicon wafer and transforming the amorphous silicon to polysilicon by placing the silicon wafer in the furnace for the high temperature process. The amorphous silicon is naturally transformed to the polysilicon during the time the temperature of the furnace increases to about 1150° C. for oxidizing the silicon wafer without additional an process for transformation.

Figure 9:
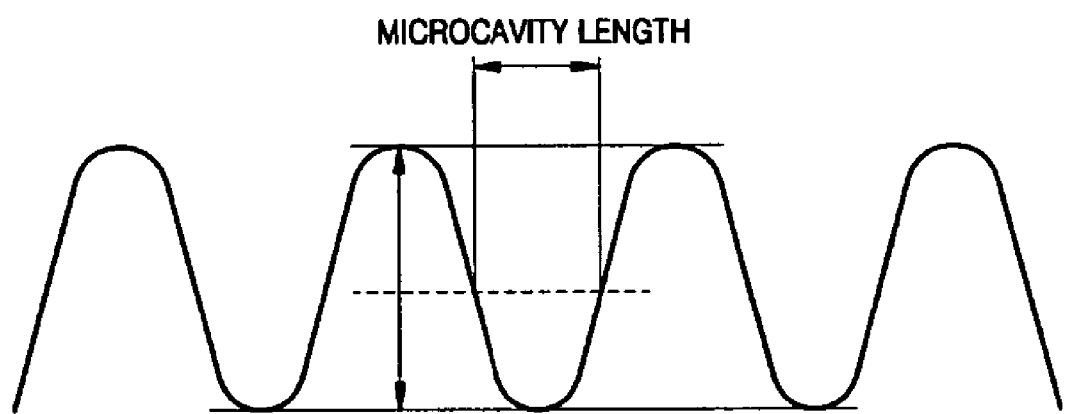
FIG. 9 shows the definition of a microcavity length of a microdefect flection pattern.

In the instances of FIGS. 8A through 8C, the lengths of microcavities in each of three samples are about 4.5 µm, about 5 µm, about 7 µm. In the present test, the length of the microcavity is several microns as shown. However, the length of the microcavity can be reduced to a nanometer unit according to the depth of amorphous silicon and formation conditions. As shown in FIG. 9, the length of the microcavity is a distance between adjacent two microdefects which is measured from a middle of one microdefect height to a middle of another microdefect height when a microdefect height is a distance from a valley of a microdefect flection to a peak of the microdefect flection.

As known from a comparison between FIG. 8A and FIGS. 8B and 8C, a microcavity length of a microdefect flection pattern formed on the $SiO_2$/Si interface when the polysilicon is formed is longer than a microcavity length of a microdefect flection pattern formed on the SiO2/Si interface when the polysilicon is not formed.

Also, as shown in FIGS. 8B and 8C, a microcavity length of a microdefect flection pattern becomes longer when deeper polysilicon is formed because of difference between an oxidation rate of the polysilicon and the same of crystalloid silicon.

Accordingly, the deepest polysilicon is formed on a region where a microdefect flection pattern to emit and/or receive a red light is to be formed and the shallowest polysilicon is formed on a region where a microdefect flection pattern to emit and/or receive a blue light is to be formed, in the instance of forming a microdefect flection pattern having a predetermined microcavity length enabling a red light, a green light, and a blue light to emit and/or receive.

FIGS. 2A through 2D show an example in which the first, the second and the third amorphous silicon 13, 23, 33 are formed on corresponding regions of the substrate 1 to have predetermined depths for emitting and/or receiving a red light, a green light, and a blue light. That is, the first amorphous silicon 13 is formed by implanting a preamorphization material until reaching to the shallowest depth, the second amorphous silicon 23 is formed by implanting a preamorphization material until reaching to middle depth and the third amorphous silicon 33 is formed by implanting a preamorphization material until reaching to the deepest depth. In this case, the first polysilicon 15 formed in the region of the first amorphous silicon 13 is formed to have the shallowest depth, thereby a microdefect flection pattern having the shortest period which is proper to the wavelength of a blue light is formed. The second polysilicon 25 formed in the region of the second amorphous silicon 23 is formed to have middle depth, thereby a microdefect flection pattern having middle period which is proper to wavelength of the green light is formed. The third polysilicon 35 formed in the region of the third amorphous silicon 33 is formed to have the deepest depth, thereby a microdefect flection pattern having long period which is proper to wavelength of the red light is formed.

When a silicon optoelectronic device is arranged in a two-dimensional array, a group of the first, the second and the third amorphous silicon 13, 23, 33 having different depths is arranged to form a two-dimensional array corresponding to the two-dimensional array of the silicon optoelectronic device. The arrangement of the first, the second and the third amorphous silicon 13, 23, 33 may be modified in various ways. A panel inputting or/and outputting light corresponding to the color image signal in a pixel unit can be produced by forming the first, the second and the third amorphous silicon 13, 23, 33 to be arranged as a two-dimensional array as described above, transforming the amorphous silicon to the polysilicon by the high temperature process, and performing the oxidation process, etching process, doping process and electrode patterning process which will be explained hereafter.

The chlorine gas increases an oxidation rate during a dry oxidation process. That is, the chlorine gas accelerates reaction or diffusion of oxidant at an interface between an oxidation layer, i.e., silicon oxidation layer 40 and a silicon layer, i.e., the substrate 1. The chlorine gas traps and neutralizes pollution of nitrogen in the oxidation layer. The chlorine gas also getters metallic impurities and stacking faults from the silicon layer. If the chlorine gas is included in the gas atmosphere in more than the threshold concentration, it causes the formation of additional phases at the interface between the oxidation layer and the silicon layer due to accumulation of gaseous oxidation product. Therefore, the interface between oxidation layer and silicon layer ($SiO_2$/Si) becomes more roughened.

Since such existence of chlorine gas makes $SiO_2$/Si interface to be roughened, a precise microdefect flection pattern can be obtained and a high quality of silicon oxidation layer 40 can be formed.

Figure 4:
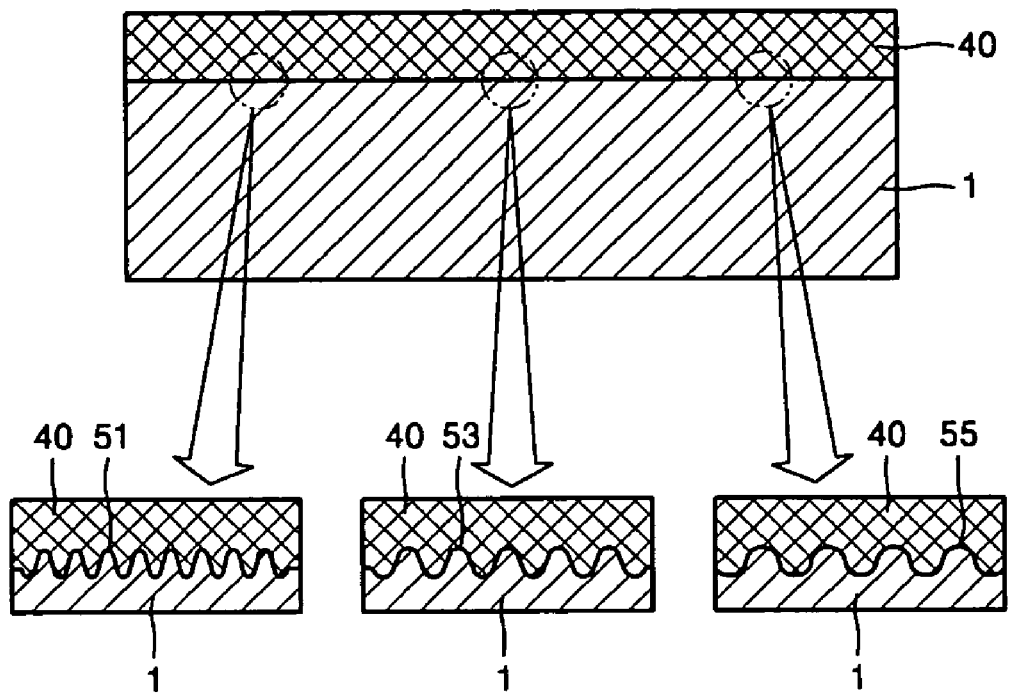

The first, the second and the third microdefect flection pattern are formed at the $SiO_2$/Si interface region corresponding to the first, the second and the third polysilicon 15, 25, 35 as shown in magnified parts of FIG. 4 by forming the first, the second and the third polysilicon 15, 25, 35 having different depths and oxidizing a predetermined thickness of the substrate 1 for forming the silicon oxidation layer 40 on the substrate 1.

Since the depths of the first, the second and the third polysilicon 15, 25, 35 are different, a period of the microdefect in the first, the second and the third microdefect flection patterns are differently formed due to the oxidation rate between a polysilicon and single crystalloid silicon. That is, the microcavity lengths in the first, the second and the third microdefect flection pattern are different.

The microdefect of the first microdefect flection pattern 51 may be formed to have a period to emit and/or to receive light of the blue wavelength region. The microdefect of the second microdefect flection pattern 52 may be formed to have a period to emit and/or to receive light of the green wavelength region. The microdefect of the third microdefect flection pattern 53 may be formed to have a period to emit and/or to receive light of the red wavelength region.

Figure 5A:
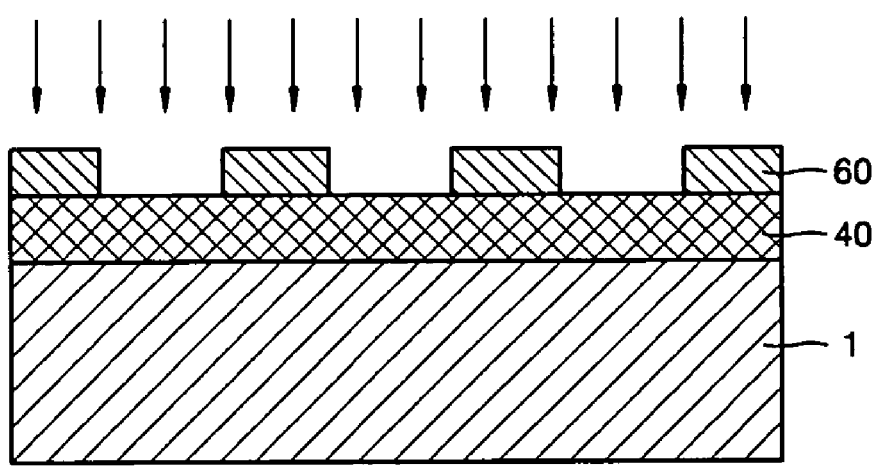
Figure 5B:
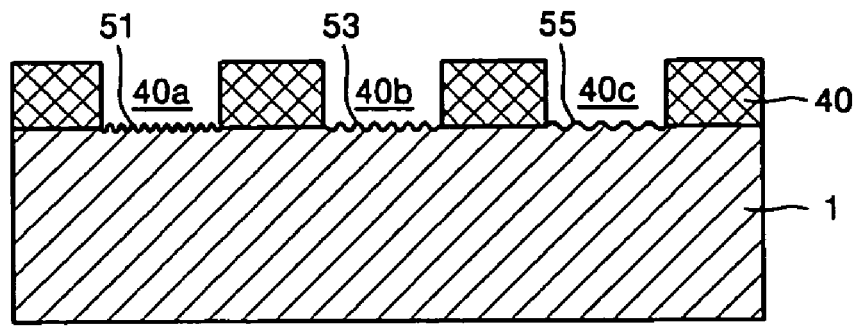

After performing the oxidation process as described above, an etching process is performed as shown in FIGS. 5A and 5B. That is, regions of the silicon oxidation layer 40 where the first, the second and the third polysilicon 15, 25, 35 were formed are etched to expose the first, the second and the third microdefect flection patterns 40a, 40b, 40c formed at the interface between the silicon oxidation layer 40 and the substrate 1. The first, the second and the third microdefect flection patterns are exaggeratingly shown in the FIGS. 5A and 5B.

Referring to FIG. 5A, a photoresist layer 60 is formed on the silicon oxidation layer 40 and the photoresist layer 60 is patterned to expose regions of the silicon oxidation layer 40 corresponding to the first, the second and the third polysilicon 15, 25, 35. After patterning, the etching process is carried out for etching the exposed silicon oxidation layer 40. After etching the exposed silicon oxidation layer 40, the photoresist layer 60 is eliminated. As a result, the silicon oxidation layer 40 pattern having openings 40a, 40b, 40c obtained by eliminating the regions of the silicon oxidation layer 40 where the first, the second and the third polysilicon 15, 25, 35 are formed is obtained as shown in FIG. 5B.

Figure 6:
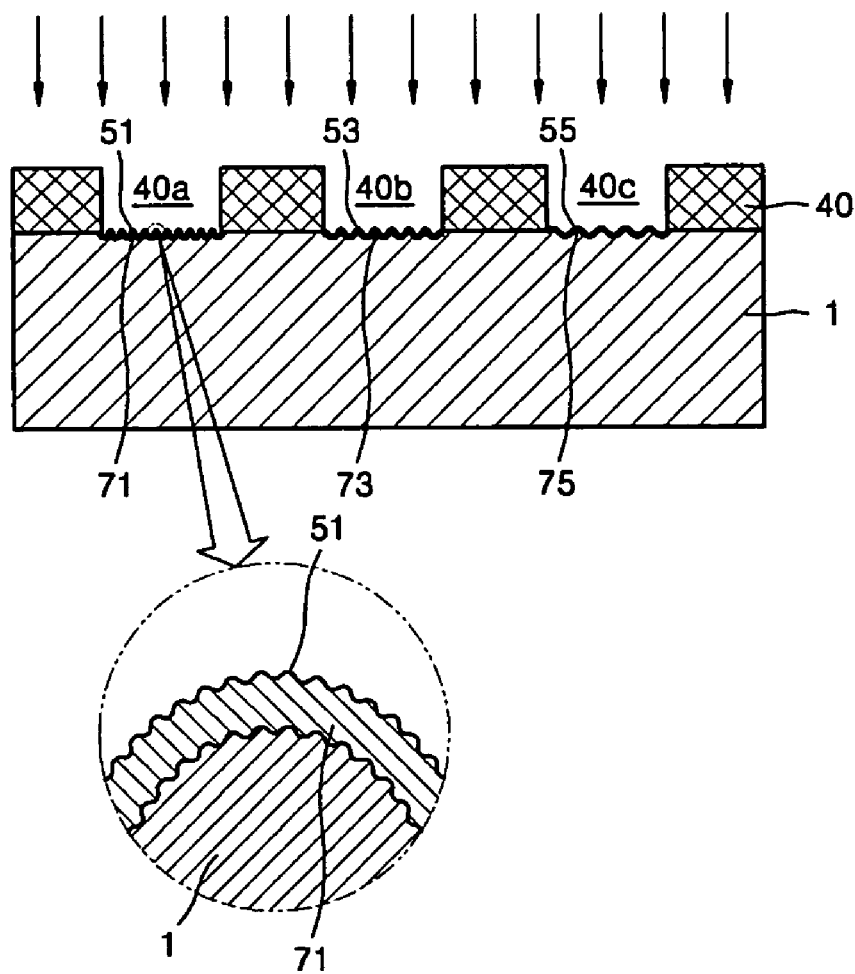

Referring to FIG. 6, after patterning of the silicon oxidation layer 40, the first, the second and the third microdefect flection pattern 51, 53, 55 are doped with a type opposite to the substrate 1 in an ultra shallow depth, for example, about 10 to 20 nm depth by using the silicon oxidation layer 40 pattern as a mask, thereby forming a first, a second and a third doping regions 71, 73 and 75.

Figure 10:
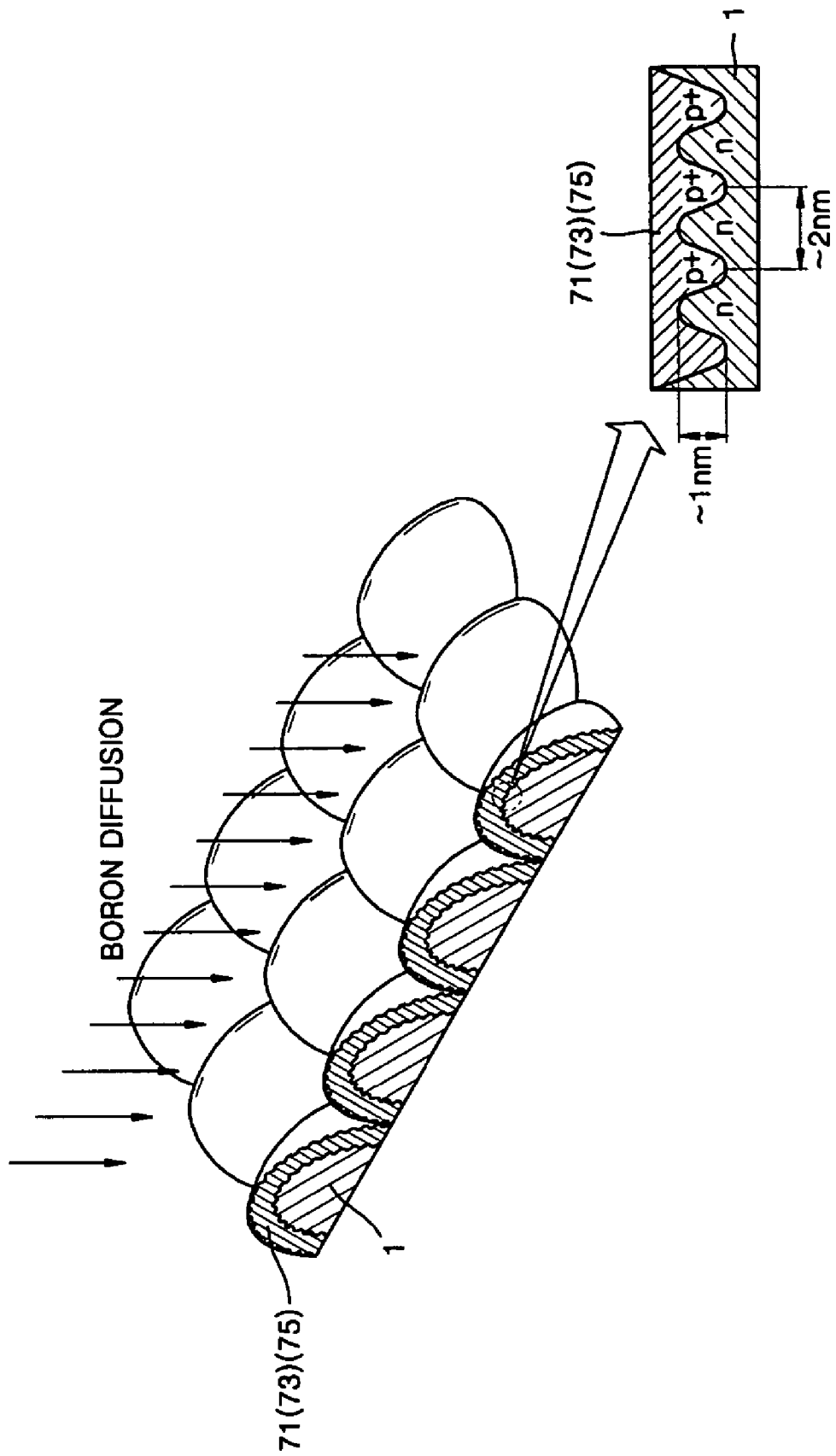
FIG. 10 shows a microdefect flection pattern and a quantum structure of a p-n junction region of a ultra shallow doping region.

When a predetermined dopant such as boron or phosphorous is injected into the substrate 1 through the openings 40a, 40b, 40c of the silicon oxidation layer 40 pattern by a non-equilibrium diffusion process (for example), there are formed ultra-shallowly doped region with the opposite type to the substrate 1, for example, a p+ type, along the surfaces of the first, the second and the third microdefect flection pattern 51, 53, 55. As a result, the first, the second and the third doping regions 71, 73, 75 having the quantum structure are formed at the p-n junction between the doping region and the substrate 1. The magnified part of FIG. 6 shows the p-n junction between the substrate and the first doping region 71. In FIG. 6, the first, the second and the third microdefect flection pattern 15, 25, 35, and the first, the second and the third doping region 71, 73, 75 are exaggeratingly shown. FIG. 10 shows a microdefect flection pattern and a quantum structure of a p-n junction region of a doping region.

Although a non-equilibrium diffusion process is used herein for the formation of the ultra-shallow doping regions 71, 73, 75 having the quantum structure at the p-n junction, another process such as an implantation process can also be used while the doping regions can be formed to a desired shallow depth.

The substrate 1 may be doped as p type, and the first, the second and the third doping regions 71, 73, 75 may be doped as n+ type.

As mentioned above, when the doping process is controlled so that the doping regions can be formed to an ultra-shallow depth, a quantum structure including at least one of a quantum well, a quantum dot and a quantum wire is formed at an interface between the doping regions of the substrate 1, i.e., p-n junction. Therefore, the quantum confinement effect occurs at the p-n junction, thereby expressing the photoelectric conversion effect.

Quantum wells are mostly formed at the p-n junction regions. Quantum dot or quantum wire may be formed at the p-n junction regions. A composite structure including two or more types of the quantum well, the quantum dot and the quantum wire may be also be formed at the p-n junction.

At the quantum structure of the p-n junction, doping regions of opposite conductivity types alternate with each other. The sizes wells and barriers may be, for example, about 2 and 1 nm, respectively as shown in FIG. 10.

Such ultra-shallow doping forming the quantum structure at the p-n junction can be accomplished by optimally controlling deformed potential of a surface by diffusion temperature and microdefect flection pattern.

The thickness of a diffusion profile can be adjusted to approximately 10-20 nm by an appropriate diffusion temperature and a deformed potential due to the microdefect flection pattern formed along the surface of the substrate during a diffusion process. The quantum structure is created by the ultra-shallow diffusion profile thus formed.

As well known in the field of the diffusion technology, when the silicon oxidation layer 40 thicker than an appropriate thickness e.g. several thousand angstrom (Å) or a diffusion temperature is low, vacancies mainly affect diffusion, thereby causing a deep diffusion. On the other hand, when the silicon oxidation layer 40 is thinner than an appropriate thickness or the diffusion temperature is high, silicon self-interstitials mainly affect diffusion, thereby causing a deep diffusion.

The diffusion mechanism includes mainly a kick-out mechanism by the self-interstitial and a vacancy mechanism by the vacancy. The silicon oxidation layer 40 works as a source providing the silicon self-interstitial influencing the diffusion. When the silicon oxidation layer 40 is thin, diffusion is mostly generated by the kick-out mechanism by the self-interstitial and when the silicon oxidation layer 40 is thicker, and diffusion is mostly generated by the vacancy mechanism since an amount of the self-interstitial is small. In the above two instances, when the effect of silicon self-interstitial or vacancy appears very deep diffusion is generated.

However, when a silicon oxidation layer 40 is formed to an appropriate thickness to be generated silicon self-interstitial and vacancy in at a similar ratio, the combination of the silicon self-interstitials and the vacancies do not accelerate dopant diffusion. As a result, an ultra-shallow doping is accomplished. The physical properties of the vacancies and the self-interstitials as used herein are well known in the field of the diffusion technology, and thus, the detailed descriptions thereof will be omitted.

When a condition in which vacancy and silicon self-interstitial do not influence dopant diffusion is satisfied, an ultra-shallow doping depth of several tens nm can be accomplished.

By the above mentioned doping process, the first, the second and the third doping regions 71, 73 and 75 are formed at the regions of the first, the second and the third microdefect flection pattern 51, 53, 55 through the openings 40a, 40b, 40c of the silicon oxidation layer pattern. In this case, since the first, the second and the third microdefect flection pattern 51, 53, and 55 are formed to have different periods, the first, the second and the third doping region 71, 73, 75 are formed to have a period for receiving and/or emitting lights of blue B, green G, and red R wavelength.

Figure 7:
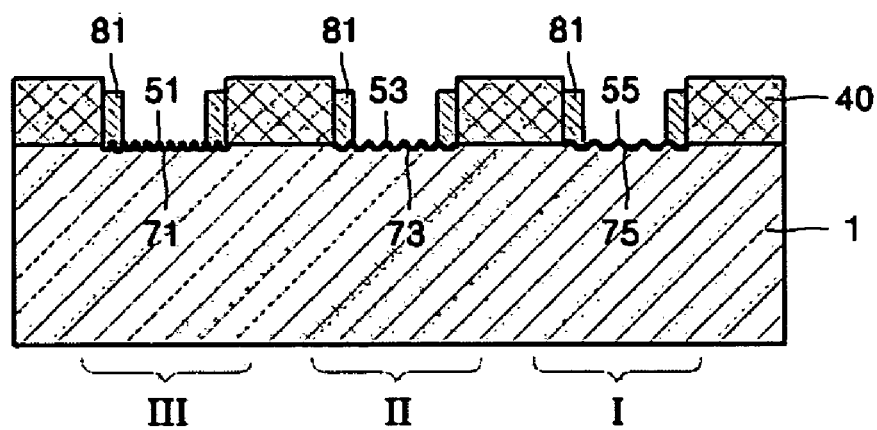

Lastly, when a first electrode pattern 81 is formed on the substrate 1 to be electrically connected to the first, the second and the third doping region 71, 73, 75, as shown in FIG. 7, a silicon optoelectronic device shown in FIG. 7 can be obtained. As shown, the silicon optoelectronic device includes array of three silicon optoelectronic elements for emitting and/or receiving three different wavelengths, such as a first silicon optoelectronic element I for a blue light, a second silicon optoelectronic element II for a green light, and a third silicon optoelectronic element III for a red light. On a bottom of the substrate 1, a second electrode (not shown) is commonly formed.

In the method of manufacturing the silicon optoelectronic device according to the present invention, the oxidation process is performed after forming the first, the second and the third polysilicon 15, 25, 35. Therefore, the microcavity length can be easily controlled and single oxidation process can form the microdefect flection patterns having microcavities for the blue wavelength B, the green wavelength G, the red wavelength R. Therefore, an optoelectronic device for R, G, B can be formed in single wafer. On the other hand, in the instance of a prior method for forming naturally a microdefect flection pattern by controlling conditions of oxidation process which is disclosed in the U.S. patent application Ser. No. 10/122,421, it is difficult to control the microcavity length and a microdefect flection pattern having microcavity length for R, G, B must be formed on different wafers. Also, three oxidation processes must be performed for R, G, B. Accordingly, the prior method requires a large amount time, i.e., three times more than the present invention for performing the oxidation process. In the other hand, an optoelectronic device can be rapidly manufactured according to the method of the present invention because the number of oxidation processes, which require a large amount of time, is reduced in the present invention.

Furthermore, in a case of the microdefect flection pattern self-assembled along a surface of a substrate by controlling conditions of oxidation process which is disclosed in the U.S. patent application Ser. No. 10/122,421, samples of R, G, B must be prepared separately and the samples are assembled for providing a white light. In the present invention, the optoelectronic devices for R, G and B can be embodied on single wafer as a pattern form.

The method of manufacturing three adjacent silicon optoelectronic devices or two-dimensional array structure of the three silicon optoelectronic devices for receiving and/or emitting the red, the green, and the blue light on the substrate 1 is explained and shown above. However, the arrangement of the silicon optoelectronic devices on the substrate 1 may be modified in various ways.

Also, at least one optoelectronic device for single light color or a two-dimensional array structure of the same may be formed on the substrate 1. For example, one of silicon optoelectronic devices for a red light R, a green light G and a blue light B may be formed on the substrate 1 by implanting the preamorphization material into the substrate 1 to have a predetermined depth for forming the corresponding depth of polysilicon according to a desired light color.

In the instance of forming the at least one optoelectronic device for single color light or a two-dimensional array structure of the same on the substrate 1, processes shown in FIGS. 2B and 2C can be omitted among processes shown in FIGS. 2A through 2E because only one type of amorphous silicon is formed.

Figure 11:
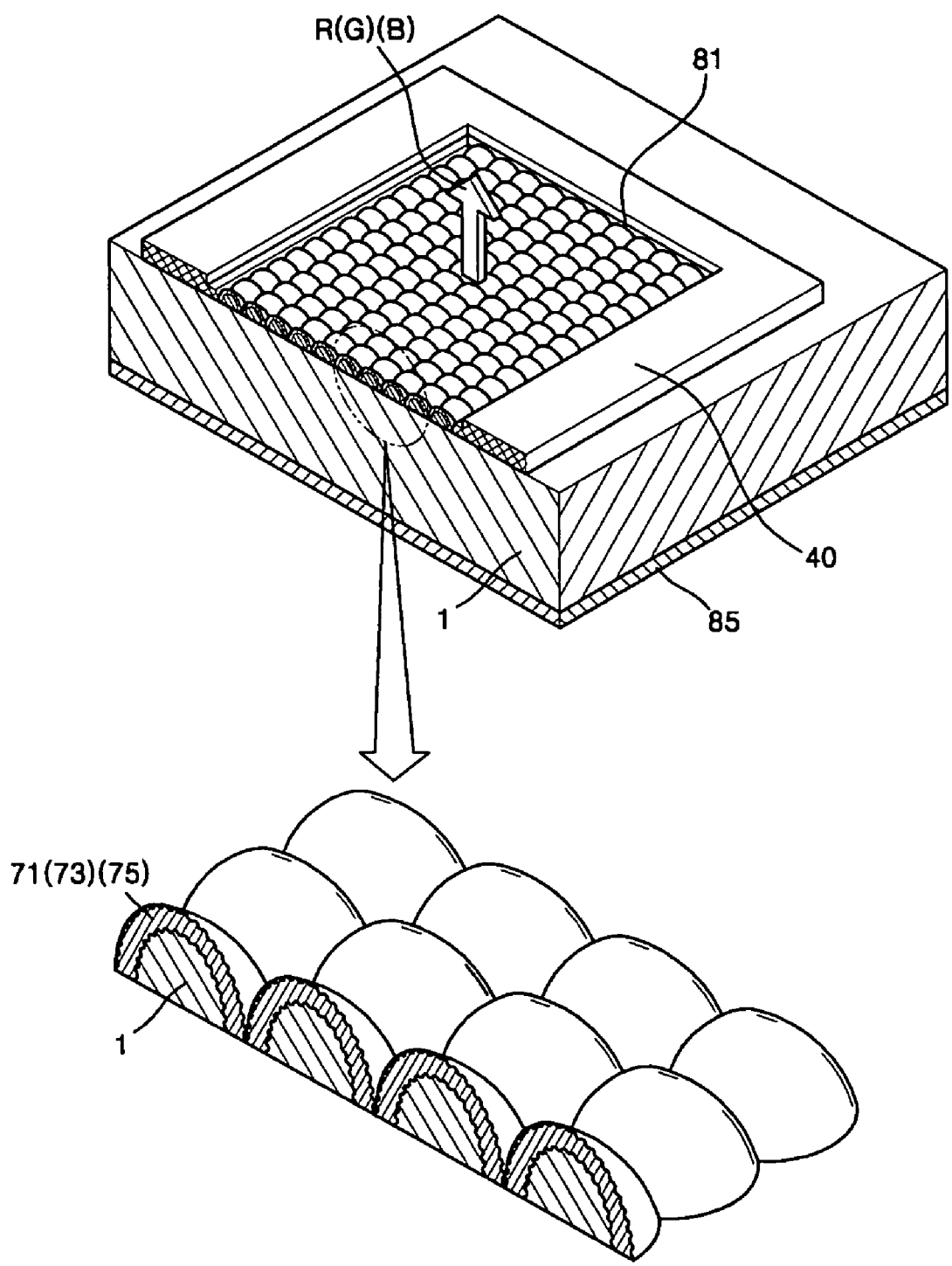
FIG. 11 is a schematic view of one silicon optoelectronic element of a silicon optoelectronic device for emitting or/and receiving light of a plural of wavelengths, which is manufactured by manufacturing processes shown in FIGS. 1 through 7.

FIG. 11 is a schematic view of one silicon optoelectronic device portion of a silicon optoelectronic device for emitting or/and receiving light of a plural of wavelengths, which is manufactured by the processes shown in FIGS. 1 through 7.

Referring to FIG. 11, a first electrode 81 is formed on a surface of the substrate 1 where the doping regions 17, 73, 75 are formed and a second electrode 85 is formed on the bottom of the substrate. The same reference numerals as in the above-described drawings indicate substantially the same constitutional elements. FIG. 11 shows that the first electrode 81 made of an opaque metal is formed in such a way to be in contact with external sides of the doping regions 71, 73, 75. The first electrode 81 may also be made of a transparent electrode material such as indium tin oxide (ITO). In this case, the first electrode 81 may be formed on the entire surface of the doping regions 71, 73, 75.

In the silicon optoelectronic device portion shown in FIG. 11, the doping regions 71, 73, 75 are formed by forming the microdefect flection patterns at the interface between the silicon oxidation layer 40 and the substrate 1 to have a predetermined microcavity length by difference of oxidation rates between the polysilicon having a predetermined depth and single crystalloid silicon during the oxidation process, exposing the formed microdefect flection patterns by etching process and ultra-shallowly doping the exposed microdefect flection patterns.

The silicon optoelectronic device of the present invention can be used as a light-emitting and/or a receiving device since the p-n junction formed between the doping regions 71, 73, 75 and the substrate 1 has a quantum structure at which the creation and recombination of electrons-holes pairs occur.

That is, the silicon optoelectronic device may function as a light-emitting device as follows. For example, if an electric power (voltage or current) is applied across the first electrode 81 and the second electrode 85, carriers, i.e., electrons and holes, are injected into the quantum wells of the p-n junction and recombined (annihilated) at a subband energy level of the quantum wells. In this case, electro luminescence (EL) occurs at various wavelengths according to the recombination state of carriers, and only light of specific wavelength is amplified and emitted due to microcavity length, that is period of the microdefect of the microdefect flections 51, 53, and 55. The quantity of light generated varies depending on the magnitude of the electric power (voltage or current) applied across the first and the second electrodes 81 and 85.

The silicon optoelectronic device also may function as a light-receiving device as follows. When only light of a specific wavelength band according to the microdefect period of the microdefect flection pattern artificially formed is incident on the p-n junction and photons are absorbed in the p-n junction of the quantum well structure, electrons and holes are excited at a subband energy level of the quantum well formed at the p-n junction. Therefore, when an external circuit, for example, a load resistance (not shown) is connected to an output terminal, current proportional to the quantity of light received is output.

The silicon optoelectronic device according to the present invention as described above has high quantum efficiency since the quantum confinement effect occurs due to local variations in potential of charge distribution at the p-n junction of the ultra-shallow doping regions 71, 73 and 75 and a subband energy level is formed in the quantum well.

As described above, the silicon optoelectronic device for emitting and/or receiving a red light, a green light and a blue light at different doping regions can be obtained by forming the first, the second and the third polysilicons 15, 25, 35, performing the oxidation process for forming the first, the second and the third microdefect flection patterns 51, 53, 55 having different microcavity lengths corresponding to a blue wavelength band B, a green wavelength band G and a red wavelength band R at the interface between the silicon oxidation layer 40 and the substrate 1, and performing the etching process and the doping process.

Generally, an optoelectronic device to emit and/or receive a red light, a green light and a blue light is required for producing color image. In consideration of this requirement, in the present embodiment above described, the method of manufacturing the silicon optoelectronic device for wavelengths of a red, a green, and a blue is explained and shown. However, this is for exemplary purposes and the present invention can be applied to manufacture a silicon optoelectronic device for more than three wavelengths by forming a plurality of polysilicons having various depths and performing the above mentioned processes.

According to the present invention, a silicon optoelectronic device may be manufactured to have superior characteristics for selecting and amplifying of a specific wavelength band because a microdefect flection pattern having desired microcavity length can be formed on the substrate 1.

As described above, it was not easy to control the microcavity length because the microcavity is self-assembled in a conventional method described in the U.S. patent application Ser. No. 10/122,421. In the instance of the self assembled microcavity described in the U.S. patent application Ser. No. 10/122,421, it is easily generated that microcavities for various wavelengths are mixed and process conditions for selecting a specific wavelength cannot be easily defined.

However, in the present invention, since the amorphous silicon is formed to have a predetermined depth by controlling the implanting depth of the preamorphization material and the amorphous silicon is transformed to the polysilicon by a high temperature process, the polysilicon having a depth for a desired wavelength is obtained. After forming the polysilicon, the polysilicon formed substrate is oxidized and thus, the microdefect flection patterns are formed to have the desired microcavity length by the difference between an oxidation rate of the polysilicon and that of the crystalloid silicon. Therefore, a silicon optoelectronic device for a specific wavelength band can be easily manufactured according to the method of the present invention, and uniformity and reproducibility are improved.

More specifically, it is possible to filter only the light of a specific wavelength band because a microdefect flection pattern having regularly formed microdefects can be formed on a surface of the silicon optoelectronic device according to the present invention. It is also possible to amplify the light of a specific wavelength band or to attenuate the light of unwanted wavelength band by regularly forming microdefects on a surface of the silicon optoelectronic device as mentioned above, in comparison with a structure having an irregular microdefect pattern or plane.

Hereinafter, an image input and/or output apparatus will be explained as an embodiment of a device having the silicon optoelectronic device array according to the present invention.

Figure 12:
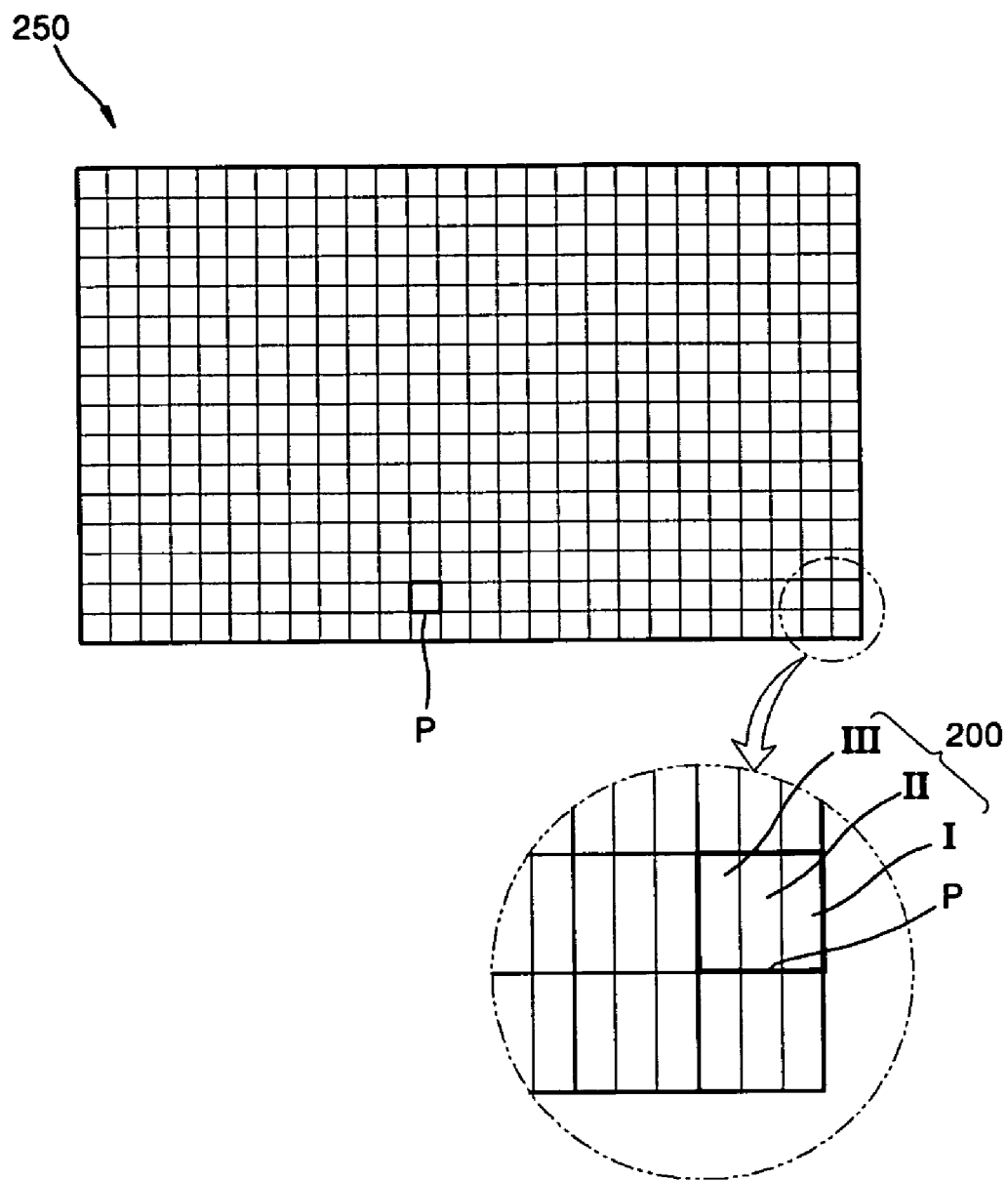
FIG. 12 is a schematic plane diagram of an image input and/or output device according to an embodiment of the present invention.

FIG. 12 is a schematic plane diagram of an image input and/or output apparatus according to an embodiment of the present invention.

Referring to FIG. 12, the image input and/or output apparatus according to the present invention includes a silicon optoelectronic device panel 250 having a two-dimensional array of silicon optoelectronic devices 200, each of which leads to input and/or output of an image, formed on an n-type or a p-type silicon-based single substrate 1. The term, "image output" as used herein means substantially an image display. The term, "image input" as used herein indicates substantially the generation of an electric image signal by a camera photographing an object.

The silicon optoelectronic device 200 includes a first, a second and a third silicon optoelectronic elements I, II, III which are formed according to manufacturing processes shown in FIGS. 1 through 7 for emitting and/or receiving a blue light, a green light, and a red light.

Each of silicon optoelectronic elements I, II, III of the silicon optoelectronic device 200 functions as a light emitting and/or receiving device of a specific wavelength band due to the microcavity length of the microdefect flection pattern and the creation and recombination of electron-hole pairs by the quantum confinement effect at the p-n junction of the doping region which is ultra-shallowly doped along a surface of the microdefect flection pattern.

Accordingly, it is possible to manufacture a silicon optoelectronic device panel 250 for inputting and outputting an image by forming the two-dimensional array of the silicon optoelectronic device 200 on the single substrate 1 through a series of semiconductor manufacturing processes.

In this instance, an electrode is patterned on the substrate 1 used as a base of the silicon optoelectronic device panel 250 so that the input and/or output of an image can be performed on a pixel-by-pixel basis in the silicon optoelectronic device panel 250 and thus a photographed image is converted into an electrical image signal and/or an image in two-dimensions is displayed.

Accordingly, a color image can input and/or output in two-dimensions by using the silicon optoelectronic device panel 250 where the silicon optoelectronic device 200 is arranged in a two-dimensional array. In this case, the silicon optoelectronic device 200 having the first, the second and the third silicon optoelectronic element I, II, and III for B, G and R is arranged per single pixel.

As mentioned above, the electrode is patterned on the substrate 1 for inputting and/or outputting image per each pixel P in the silicon optoelectronic device panel 250.

By using the silicon optoelectronic device panel 250, the color image can be provided without being equipped with an additional color filter.

It is possible to further include a color filter (not shown) in a front surface of the silicon optoelectronic device panel 250 for further providing a clear color image.

The image input and/or output device of the present invention may be modified in various ways as follows, in a view of inputting and outputting an image. The various modifications of the image input and/or output device in a view of inputting and outputting an image are originated from modification of a circuit configuration controlling the input and/or output image.

Figure 13:
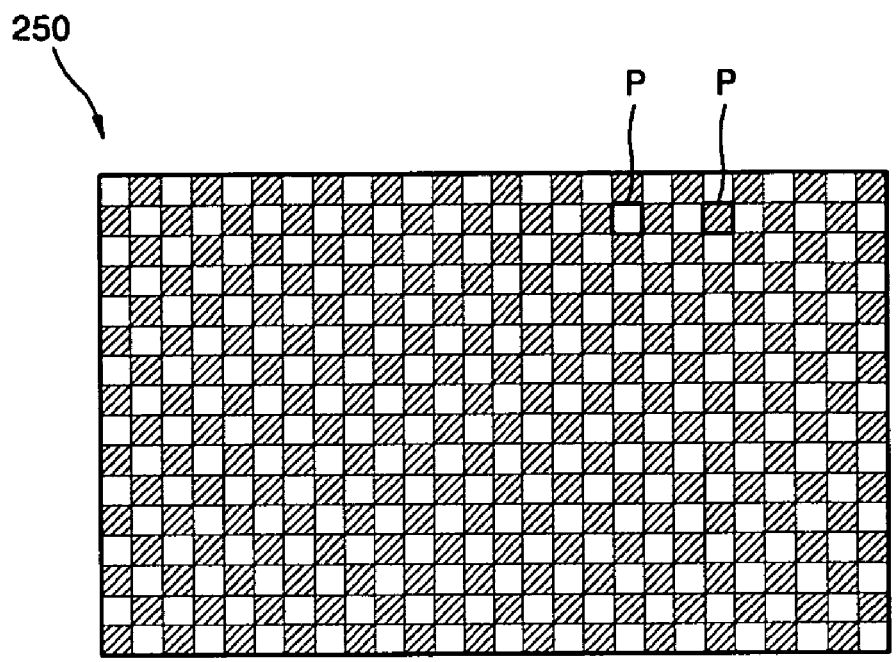
FIG. 13 is a schematic plane diagram of an image input and/or output device according to an embodiment of the present invention in a view of inputting and outputting an image.

That is, an image input and/or output apparatus according to the present invention may be formed to input and output an image using image input pixels and image output pixels that are alternately arranged as shown in FIG. 13. In FIG. 13, pixels represented by oblique lines are image input pixels where a silicon optoelectronic device 200 of the present invention is used as a light-receiving device. Also, pixels represented by empty squares are image output pixel where a silicon optoelectronic device 200 of the present invention is used as a light-emitting device.

As shown in FIG. 13, the image input and/or output device of the present invention may be formed in such a way that some of the silicon optoelectronic devices 200 of the silicon optoelectronic device panel 250 input an image and the others of the silicon optoelectronic devices 200 output an image.

The image input pixels and the image output pixels may have various arrangements. For example, pixels positioned at predetermined areas of the silicon optoelectronic device panel 250 can be used as the image input pixels and the other pixels can be used as the image output pixels.

Since the silicon optoelectronic devices 200 can be used as light-emitting and receiving devices, the image input pixels and the image output pixels can be switched and the number of the image input pixels and the image output pixels may be also be altered when needed in an image input and/or output apparatus according to the present invention in which the input and output of an image are carried out by different silicon optoelectronic devices 200 as shown in FIG. 13. Such alternation can be accomplished by appropriately designing the driving and/or control circuits and algorism of an image input and/or output apparatus according to the present invention.

Figure 14A:
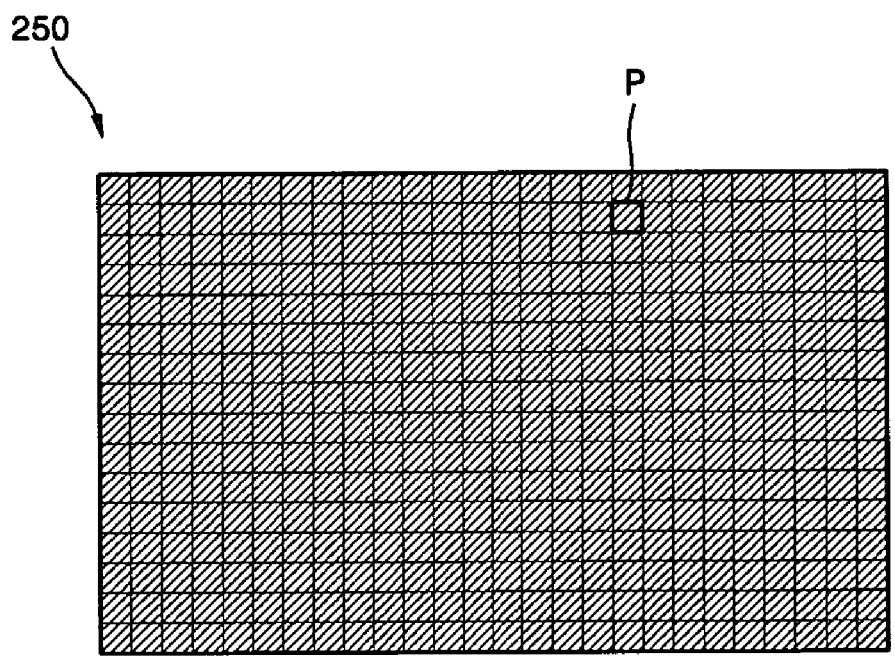
FIGS. 14A and 14B show an image input and/or output device according to another embodiment of the present invention in a view of inputting and outputting an image.
Figure 14B:
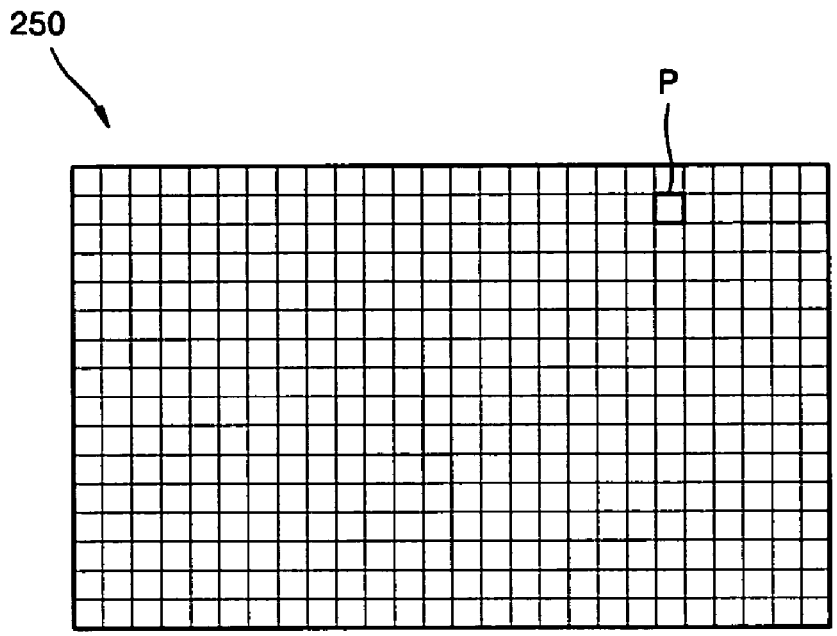

As image input and/or output apparatus according to the present invention may also be formed in such a way that the input and output of an image can be carried out by the same silicon optoelectronic device 200 of the silicon optoelectronic device panel 250 with a time difference as shown in FIGS. 14A and 14B. FIG. 14A shows an image input state of the silicon optoelectronic device panel 250 of an image input and/or output apparatus according to the present invention and FIG. 14B shows an image output state of the silicon optoelectronic device panel 250 of an image input and/or output apparatus according to the present invention.

While an image input and/or output apparatus according to the present invention has been particularly shown and described with reference to exemplary embodiments thereof, various changes thereof may be made therein without departing from the scope of the present invention.

Since an image input and/or output apparatus according to the present invention as described above can directly input optical information in a screen, it can be used in equipment for interactive visual communications and/or bidirectional information transmission such as computer monitors, televisions, in particular, digital televisions, and handheld terminals.

In this case, since an image input and/or output apparatus according to the present invention allows for input and output of an image in a single panel, no separate camera is needed for visual communications.

Handheld terminals may be various types of portable communication equipment such as mobile phones and personal digital assistants (PDAs).

Furthermore, since an image input and/or output apparatus according to the present invention can input and output an image in a single panel, a full face of an operator can be photographed and transmitted. Therefore, vividness in visual communication is enhanced.

Up until now, the present invention has been described with a view to an image input and/or output apparatus including a single silicon optoelectronic device panel having a two-dimensional array of silicon optoelectronic devices, but is not limited thereto. That is, an image input and/or output apparatus according to the present invention may include combinations of a plurality of silicon optoelectronic device panels to provide a larger screen.

Figure 15:
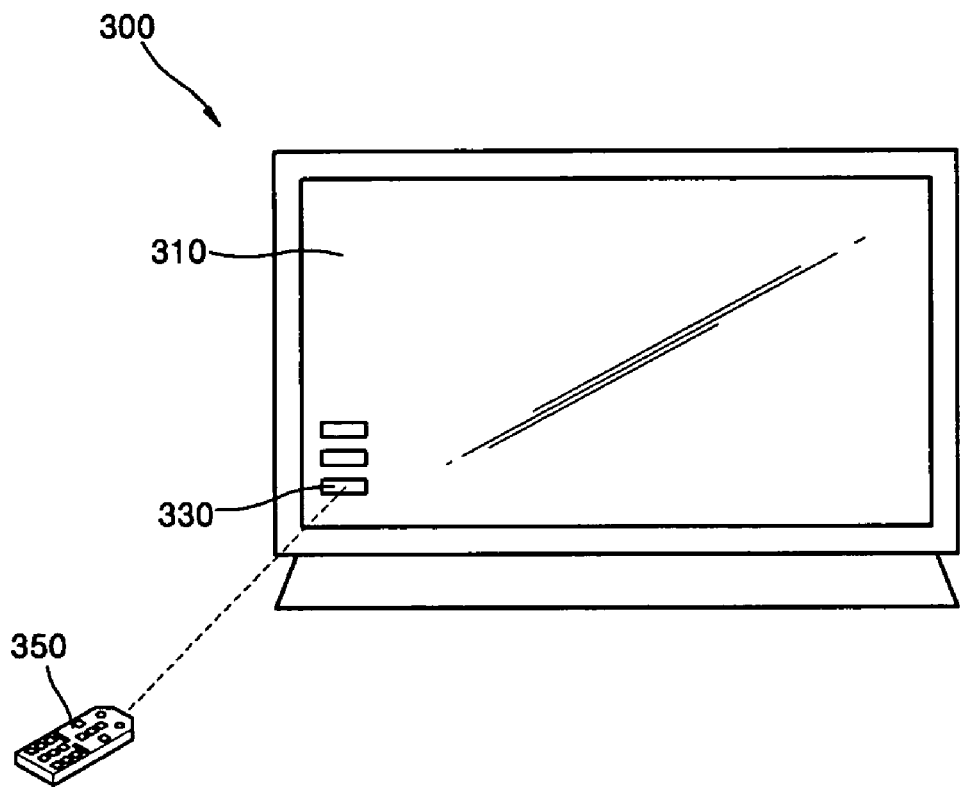
FIG. 15 shows a digital television using an image input and/or output apparatus according to the present invention.

FIG. 15 shows a digital television using an image input and/or output apparatus according to the present invention.

Referring to FIG. 15, an image input and/or output apparatus according to the present invention can be used in a digital television 300 which allows for input of information into a screen 310 and selection of a menu using an optical wireless remote controller 350. The optical wireless remote controller 350 can irradiate light only in a specific region like light pointer. When a light signal is irradiated onto a specific region within the screen 310, for example, a predetermined menu 330, from the optical wireless remote controller 350, a silicon optoelectronic device, which is positioned in the specific region and serves as a light-receiving device, receives the light signal. According to the received light signal, changing channels of the digital television or working on the Internet is possible.

In addition, an image input and/or output apparatus of the present invention can be applied to various equipments requiring bi-directional optical information transmission.

As is apparent from the above description, a microcavity length can be easily controlled according to the present invention because the oxidation process is performed after forming a plural of polysilicons having different depths for forming microdefect flection patterns having different microcavity lengths corresponding to desired specific wavelengths by the difference between oxidation rate of the polysilicon and that of the silicon. Therefore, according to the present invention, a silicon optoelectronic device having high wavelength selectivity is realized.

In addition, according to the present invention, a silicon optoelectronic device emitting and/or receiving light of different wavelengths in adjacent regions may be realized by performing the oxidation process, etching process and doping process after forming polysilicons having different depths at a plurality of regions.

Accordingly, since a microcavity length can be easily controlled and microdefect patterns having a microcavity for the red light, the green light and the blue light can be formed by a single oxidation process, a silicon optoelectronic device emitting and/or receiving a red light, a green light and a blue light can be implemented on single wafer.

Furthermore, since a silicon optoelectronic device according to the present invention can be used as both of a light-emitting device and a light-receiving device, an image input and/or output apparatus that can display an image and/or input an image or optical information in a single panel can be produced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a silicon optoelectronic device, comprising:
   preparing an n-type or a p-type silicon-based substrate;
   forming a polysilicon having a predetermined depth at one or more predetermined regions of a surface of the substrate in order to form a microdefect flection pattern having a desired microcavity length, wherein the polysilicon is formed at a different depth in each of the predetermined regions;
   oxidizing the surface of the substrate where the polysilicon is formed to form a silicon oxidation layer on the substrate and forming a microdefect flection pattern having a desired microcavity length at an interface between the substrate and the silicon oxidation layer, wherein the microdefect flection pattern is formed by a difference between an oxidation rate of the polysilicon and an oxidation rate of a material of the substrate during formation of the silicon oxidation layer;
   exposing the microdefect flection pattern by etching a region of the silicon oxidation layer where the polysilicon is formed; and
   forming a doping region by doping the exposed microdefect flection pattern in a type opposite to a type of the substrate.

2. The method of claim 1, wherein the forming of the polysilicon includes:
   forming an amorphous silicon by Implanting a preamorphization material into the predetermined region of substrate until reaching a desired depth; and
   transforming the formed amorphous silicon to a polysilicon by a high temperature process.

3. The method of claim 2, wherein the preamorphization material is a silicon ion or an inactive element.

4. The method of claim 2, wherein a plurality of microdefect patterns having a different period are formed by an oxidation process, and an etching process and a doping process are performed for manufacturing a silicon optoelectronic device having a plurality of silicon optoelectronic elements for emitting and/or receiving light of different wavelengths.

5. The method of claim 4, wherein a group of a plurality of polysilicons is formed on the substrate as a two-dimensional array, and an oxidation process, an etching process and a doping process are performed for forming a two-dimensional array of silicon optoelectronic device emitting and/or receiving light of a plurality of wavelengths.

6. The method of claim 4, wherein the preamorphization material is a silicon ion or an inactive element.

7. The method of claim 4, wherein the oxidation process is performed in a gas atmosphere containing an oxygen gas and a chlorine gas.

8. The method of claim 1, wherein the oxidation process is performed in a gas atmosphere containing of an oxygen gas and a chlorine gas.

9. The method of claim 1, further comprising forming an electrode pattern at the doping region to be electrically connected to the doping region.

10. The method of the claim 1, wherein the doping region is formed to have a quantum structure generating optoelectric conversion effect by quantum confinement effect at a p-n junction between the doping region and the substrate.

11. The method of claim 10, wherein the doping region is formed by non-equilibrium of dopant.

* * * * *